US012727262B2

(12) United States Patent
Zang et al.

(10) Patent No.: US 12,727,262 B2
(45) Date of Patent: Sep. 1, 2026

(54) PIXEL CELL FOR IMAGE SENSOR WITH VERTICAL TRANSFER GATE

(71) Applicant: OMNIVISION TECHNOLOGIES, INC., Santa Clara, CA (US)

(72) Inventors: Hui Zang, San Jose, CA (US); Qin Wang, San Jose, CA (US)

(73) Assignee: OMNIVISION TECHNOLOGIES, INC., Santa Clara, CA (US)

(*) Notice: Subject to any disclaimer, the term of this patent is extended or adjusted under 35 U.S.C. 154(b) by 375 days.

(21) Appl. No.: 18/398,852

(22) Filed: Dec. 28, 2023

(65) Prior Publication Data

US 2025/0221062 A1 Jul. 3, 2025

(51) Int. Cl.
*H10F 39/18* (2025.01)
*H10F 39/00* (2025.01)

(52) U.S. Cl.
CPC .......... *H10F 39/18* (2025.01); *H10F 39/802* (2025.01); *H10F 39/8033* (2025.01); *H10F 39/8037* (2025.01); *H10F 39/813* (2025.01)

(58) Field of Classification Search
CPC .. H10F 39/80373; H10F 39/014; H10F 39/18; H10F 39/1865; H10F 39/199; H10F 39/8027; H10F 39/8033; H10F 39/8037; H10F 39/806; H10F 39/713
See application file for complete search history.

(56) References Cited

U.S. PATENT DOCUMENTS

| | | | | |
|---|---|---|---|---|
| 9,570,507 | B2 * | 2/2017 | Nozaki | H10F 39/15 |
| 11,264,419 | B2 * | 3/2022 | Mun | H10F 39/813 |
| 12,628,448 | B2 * | 5/2026 | Hsieh | H10F 39/80373 |
| 2009/0303371 | A1 * | 12/2009 | Watanabe | H10F 39/158 257/292 |
| 2022/0271075 | A1 * | 8/2022 | Hsieh | H10F 39/807 |
| 2024/0038815 | A1 * | 2/2024 | Yamashita | H10F 39/8023 |

* cited by examiner

*Primary Examiner* — Omar F Mojaddedi
(74) *Attorney, Agent, or Firm* — Christensen O'Connor Johnson Kindness PLLC

(57) ABSTRACT

A pixel cell for an image sensor is described. The pixel cell comprises a photodiode disposed within a semiconductor substrate and a transfer gate coupled to the photodiode. The photodiode includes a shallow doped region and a deep doped region, each having a same conductivity type. The shallow doped region is disposed between a first side of the semiconductor substrate and the deep doped region. The transfer gate includes a vertical portion extending into the semiconductor substrate adjacent to the shallow doped region and from the first side towards the deep doped region of the photodiode. When the pixel cell is viewed from a plan view, the shallow doped region includes a base segment and a protrusion extending from the base segment. The protrusion is separated from the vertical portion by a first lateral separation distance and the base segment is separated from the vertical portion by a second lateral separation distance different from the first lateral separation distance.

16 Claims, 9 Drawing Sheets

PIXEL CELL FOR IMAGE SENSOR WITH VERTICAL TRANSFER GATE

TECHNICAL FIELD

This disclosure relates generally to image sensors, and in particular but not exclusively, relates to complementary metal-oxide-semiconductor image sensors.

BACKGROUND INFORMATION

Image sensors are one type of semiconductor device that have become ubiquitous and are now widely used in digital cameras, cellular phones, security cameras, as well as, medical, automobile, and other applications. As image sensors are integrated into a broader range of electronic devices it is desirable to enhance their functionality, performance metrics, and the like in as many ways as possible (e.g., resolution, power consumption, dynamic range, size, etc.) through both device architecture design as well as image acquisition processing.

The typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bit lines that vary as a function of the incident image light. In other words, the amount of image charge generated is proportional to the intensity of the image light, which is readout as analog image signals from the column bit lines and converted to digital values to produce digital images (i.e., image data) representative of the external scene.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale; emphasis instead being placed upon illustrating the principles being described.

Figure 1:
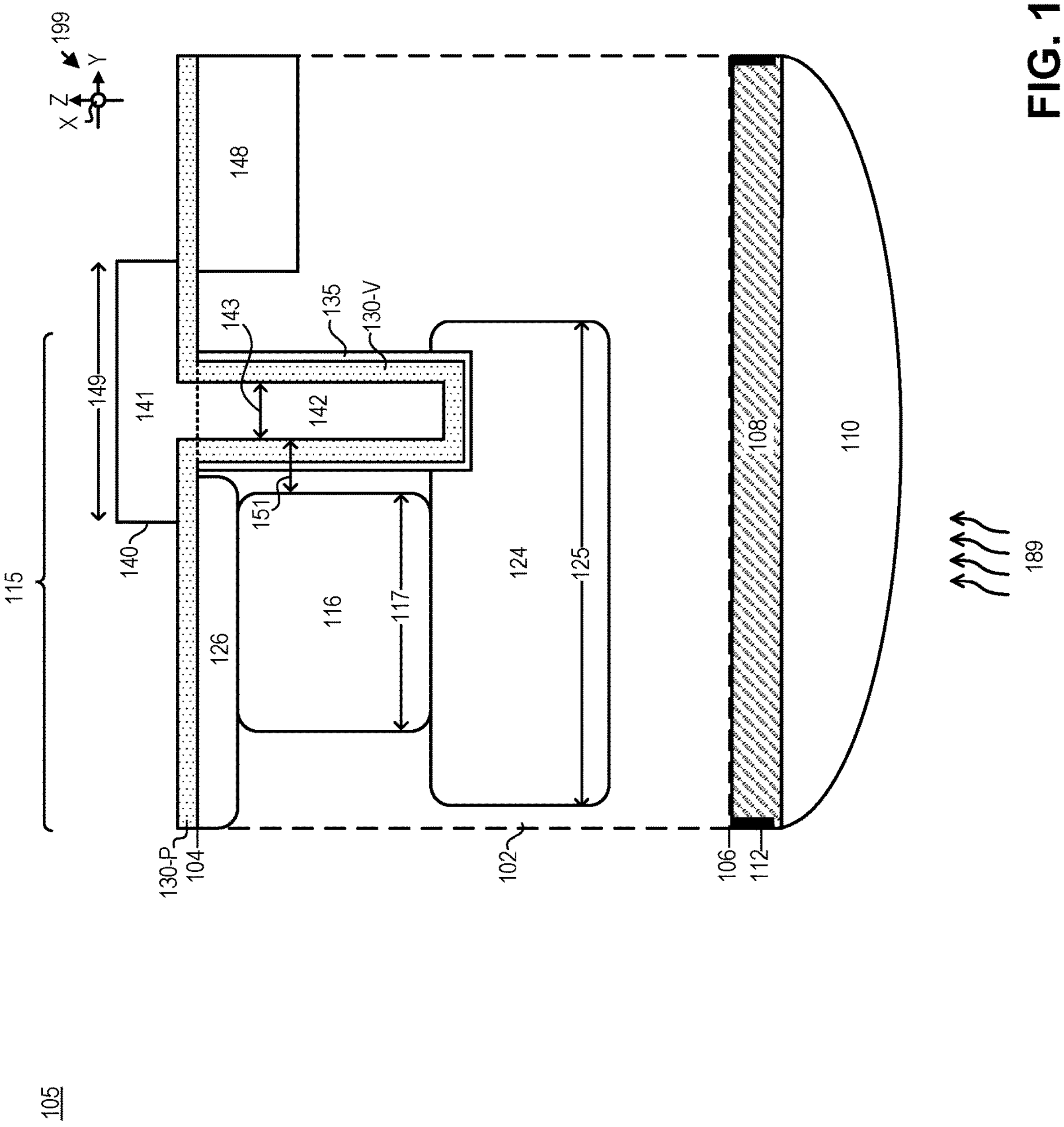
FIG. 1 illustrates a cross-sectional view of a photodiode included in a pixel cell of an image sensor with a vertical transfer gate, in accordance with an embodiment of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures can be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Embodiments of an apparatus, system, and/or method related to a pixel cell for an image sensor with vertical transfer gate are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Image sensors may be characterized based on transfer or image lag related to the time it takes to transfer photogenerated image charge from a given photodiode included in a pixel cell of the image sensor to a floating diffusion region coupled to the given photodiode via a transfer gate. Image lag may result when an image of an external scene captured by an image sensor contains information from a previously captured image (e.g., when multiple images are captured in succession). Another metric to characterize image sensors is known as white pixels, which is associated with dark current. When dark current is elevated, the image sensor may generate an inaccurate representation of dark scenes, which may be expressed as "white pixels" in the image produced by the image sensor. Embodiments disclosed herein utilize a transfer gate including a vertical portion extending into a semiconductor substrate the given photodiode is formed therein. The given photodiode of embodiments of the disclosure include a shallow doped region and a deep doped region, where the shallow doped region has a higher peak doping concentration than that of the deep doped region. It was found that spacing between the given photodiode and the vertical portion of the transfer gate is highly related to the lateral separation distance between a shallow doped region of the given photodiode and the vertical portion of the transfer gate. Therefore, there is generally a trade-off when trying to reduce image lag as it generally results in increased dark current.

However, pixel cells of embodiments of the disclosure are configured to improve both image lag and dark current. Specifically, the shallow doped region is non-uniformly separated from the transfer gate. This is achieved, at least in part, by structuring the shallow doped region of the given photodiode to include a base segment and a protrusion extending from the base segment. In one embodiment, a lateral separation distance between the vertical portion of the transfer gate and the protrusion is different from a lateral separation distance between the vertical portion of the transfer gate and the base segment. The non-uniform separation distance facilitates reduced image lag and reduced dark current. In the same or another embodiment, the given photodiode is implanted or otherwise configured such that a distance between the vertical portion of the transfer gate and a region of the given photodiode proximate to a main transfer path is proximate to the shortest lateral separation distance to reduce image lag. In the same or other embodiments, the shallow doped region of the given photodiode, the vertical portion of the transfer gate, and the floating diffusion region are collectively configured such that an axis in a plane parallel to a substrate surface plane extending through both the shallow doped region and the floating diffusion region is tangential to the vertical portion of the transfer gate. More generally, the shallow doped region is structured to facilitate reduced image lag and reduced dark current, which will be discussed throughout the disclosure.

FIG. 1 illustrates a cross-sectional view of a photodiode 115 included in a pixel cell 105 of an image sensor with a vertical transfer gate (i.e., transfer gate 140), in accordance with an embodiment of the present disclosure. It is noted that the cross-sectional view provided by FIG. 1 corresponds to a side or profile view of the image sensor along a Y-Z plane in accordance with coordinate system 199. Accordingly, the x-direction of the coordinate system 199 extends into and out of the plane of the sheet illustrated by FIG. 1. In the illustrated embodiment, the pixel cell 105 includes a semiconductor substrate 102, a first side 104 of the semiconductor substrate 102, a second side 106 of the semiconductor substrate 102 opposite the first side 104, a color filter 108, a microlens 110, a metal grid 112, the photodiode 115 including a shallow doped region 116, a deep doped region 124, and a pinning region 126, a gate dielectric 130 including a planar gate dielectric 130-P and a vertical gate dielectric 130-V, the transfer gate 140 including a planar portion 141 and a vertical portion 142, and a floating diffusion region 148.

The semiconductor substrate 102 may correspond to a part of or an entirety of a semiconductor wafer (e.g., a silicon wafer). In some embodiments, the semiconductor substrate 102 includes or is otherwise formed of silicon, a silicon germanium alloy, germanium, a silicon carbide alloy, an indium gallium arsenide alloy, any other alloys formed of III-V group compounds, combinations thereof, one or more epitaxial layers of the aforementioned materials, or a bulk substrate thereof. More specifically, the semiconductor substrate 102 may correspond to any semiconductor material or combination of materials that may be doped or otherwise configured to facilitate the photodiode 115 forming a photosensitive region of the pixel cell 105. For example, in some embodiments, the semiconductor substrate 102 may correspond to one or more epitaxial layers (e.g., P or N doped silicon) formed on a carrier wafer. In such an embodiment, the photodiode 115 may be formed in the one or more epitaxial layers corresponding to the semiconductor substrate 102 while the carrier wafer may be removed or otherwise thinned during fabrication. In one embodiment, the semiconductor substrate 102 is formed of intrinsic or extrinsic silicon having regions doped sufficiently to form the photodiode 115. For example, the shallow doped region 116, the deep doped region 124, and the pinning region 126 of the photodiode 115 may each correspond to regions of the semiconductor substrate 102 doped with the appropriate impurities to form a photosensitive region capable of generating image charge in response to incident light 189.

It is appreciated that in the illustrated embodiment, the photodiode 115 is a pinned photodiode in which the pinning region 126 has an opposite conductivity type relative to the shallow doped region 116 and the deep doped region 124. In other words, the shallow doped region 116 and the deep doped region 124 have a same conductivity type which is opposite the conductivity type of the pinning region 126 and may also be opposite the conductivity type of the semiconductor substrate 102. For example, in some embodiments, pinning region 126 has P-type conductivity and is doped with acceptor impurities (e.g., boron, aluminum, gallium, or indium) while the shallow doped region 116 and the deep doped region 124 have N-type conductivity and are doped with donor impurities (e.g., phosphorus, arsenic, antimony, or bismuth). In another embodiment, the pinning region 126 has N-type conductivity while the shallow doped region 116 and the deep doped region 124 has P-type conductivity. Furthermore, it is appreciated that in some embodiments, regions of the semiconductor substrate 102 proximate to or otherwise directly interfacing with the shallow doped region 116 and the deep doped region 124 have an opposite conductivity type as the shallow doped region 116 and the deep doped region 124 to form a PN junction to facilitate photogeneration of image charge in response to the incident light 189. Thus, in some embodiments, the semiconductor substrate 102 has an opposite conductivity type relative to the conductivity type of the shallow doped region 116 and the deep doped region 124 (e.g., when the shallow doped region 116 and the deep doped region 124 have N-type conductivity, then the semiconductor substrate 102 has P-type conductivity). In the same or other embodiments, the shallow doped region 116 and the deep doped region 124 may be formed within a well (not illustrated) formed in the semiconductor substrate 102 having an opposite conductivity type relative to the conductivity type of the shallow doped region 116 and the deep doped region 124 (e.g., when the shallow doped region 116 and the deep doped region 124 have N-type conductivity, then a well, formed within the semiconductor substrate 102 that directly interfaces with the shallow doped region 116 and/or the deep doped region 124, has P-type conductivity). It is appreciated that shallow doped region 116 and the deep doped region 124 may have different doping concentrations. For example, in one embodiment the deep doped region 124 may have a lower doping concentration (e.g., lower peak doping concentration or lower average doping concentration) relative to the shallow doped region 116.

As illustrated in FIG. 1, the shallow doped region 116, the deep doped region 124, and the pinning region 126 are each formed within the semiconductor substrate 102 and are thus each disposed between the first side 104 and the second side 106 of the semiconductor substrate 102. Additionally, the shallow doped region 116 is disposed between the deep doped region 124 and the pinning region 126. Furthermore, the shallow doped region 116 is disposed between the first side 104 of the semiconductor substrate 102 and the deep doped region 124. Similarly, the deep doped region 124 is disposed between the shallow doped region 116 and the second side 106 of the semiconductor substrate 102. In the illustrated embodiment, the shallow doped region 116 is defined, at least in part, by dimension 117 (e.g., length or width associated with the shallow doped region 116 along Y-direction of the coordinate system 199) while deep doped region 124 is defined, at least in part, by dimension 125 (e.g., length or width associated with the deep doped region 124 along Y-direction of the coordinate system 199). Dimension 117 and dimension 125 are parallel to one another as illustrated in FIG. 1. In embodiments of the disclosure, dimension 125 of the deep doped region 124 may be greater than dimension 117. More generally, a lateral area (e.g., along the x-y plane of the coordinate system 199) of the deep doped region 124 of the photodiode 115 is greater than a lateral area (e.g., along the x-y plane of the coordinate system 199) of the shallow doped region 116 (see, e.g., FIG. 2A-3B).

In the illustrated embodiment, the microlens 110 and the color filter 108 are each optically aligned with the shallow doped region 116 and the deep doped region 124. The microlens 110 (e.g., molded plastic or polymer material) is structured to form an optical structure to focus or otherwise direct the incident light 189 through the respective color filter 108 and beyond the second side 106 of the semiconductor substrate 102 to be incident upon the shallow doped region 116 and/or the deep doped region 124.

Accordingly, in some embodiments, the second side 106 of the semiconductor substrate 102 may be referred to as a light-receiving surface. The color filter 108 corresponds to a red color filter, a green color filter, a blue color filter, an infrared color filter, a clear, transparent, or white color filter, a cyan color filter, a magenta color filter, a yellow color filter, a black color filter, or any other type of color filter that selectively transmits a particular range of wavelengths included in the incident light 189 such that image charge photogenerated by the photodiode 115 in response to the incident light 189 is representative of the particular range of wavelengths.

The pixel cell 105 also includes the transfer gate 140 (e.g., polycrystalline silicon) coupled to the photodiode 115 to facilitate transfer (e.g., in response to a transfer signal applied to the transfer gate 140) of the photogenerated image charge from the photodiode 115 to the floating diffusion region 148. The transfer gate 140 may be referred to as a vertical transfer gate within the disclosure as the transfer gate 140 includes both the planar portion 141 and the vertical portion 142. As illustrated, the planar portion 141 of the transfer gate 140 is disposed proximate to the first side 104 of the semiconductor substrate while the vertical portion 142 of the transfer gate extends from the planar portion 141 into the semiconductor substrate 102 (e.g., through the first side 104) towards the second side 106 of the semiconductor substrate. In other words, the planar portion 141 of the transfer gate 140 is coupled to the vertical portion 142 to form an individual gate electrode for forming a transfer transistor to facilitate transfer of image charge photogenerated by the photodiode 115 to the floating diffusion region 148. In the illustrated embodiment, the planar portion 141 of the transfer gate 140 is defined, at least in part, by dimension 149 (e.g., length or width of the planar portion 141) while vertical portion 142 of the transfer gate 140 is defined, at least in part, by dimension 143 (e.g., length or width). In some embodiments, dimension 143 and dimension 149 are parallel to one another as illustrated in FIG. 1. In embodiments of the disclosure, dimension 149 of the planar portion 141 is greater than dimension 143 of the vertical portion. In other words, lateral dimensions (e.g., along the x- or y-axis of the coordinate system 199) of the planar portion 141 of the transfer gate 140 is greater than corresponding lateral dimensions of the vertical portion 142 of the transfer gate 140. More generally, a lateral area (e.g., along the x-y plane of the coordinate system 199) of the planar portion 141 is greater than a lateral area (e.g., along the x-y plane of the coordinate system 199 parallel to the lateral area of the planar portion 141) of the vertical portion 142. It is appreciated that a geometric center of the vertical portion 142 may not be positioned to align or otherwise overlap with a corresponding geometric center of the planar portion 141 (see, e.g., FIG. 2A-4). In other words, geometric centers of the vertical portion 142 and the planar portion 141 do not overlap or are otherwise offset from one another.

The transfer transistor further includes the gate dielectric 130 (e.g., silicon dioxide, hafnium dioxide, other insulating materials, or combinations thereof), which may be segmented, for the sake of description, into a planar gate dielectric 130-P and a vertical gate dielectric 130-V that collectively isolate (physically and electrically) the transfer gate 140 from at least the shallow doped region 116, the deep doped region 124, and the floating diffusion region 148 that form the source/drain regions of the transfer transistor. The planar gate dielectric 130-P extends proximate to the first side 104 of the semiconductor substrate and is disposed between the planar portion 141 of the transfer gate and the shallow doped region 116 of the photodiode 115. The vertical gate dielectric 130-V surrounds the vertical portion 142 of the transfer gate 140 such that the vertical gate dielectric 130-V is disposed between the shallow doped region 116 and the vertical portion 142 of the transfer gate 140, the vertical gate dielectric 130-V is disposed between the floating diffusion region 148 and the vertical portion 142 of the transfer gate 140, and the vertical gate dielectric 130-V is disposed between the deep doped region 124 and the vertical portion 142 of the transfer gate 140. In some embodiments, the semiconductor substrate 102 may be doped to form a passivation region 135 disposed proximate to the vertical gate dielectric 130-V. The passivation region 135 extends around the vertical gate dielectric 130-V, which may provide similar functionality as the pinning region 126 and enhance performance of the transfer transistor. Accordingly, the passivation region 135 has an opposite conductivity type as the conductivity type of the shallow doped region 116 and the deep doped region 124 (e.g., when the conductivity type of the shallow doped region 116 and the deep doped region 124 are N-type, the conductivity of the passivation region 135 is P-type). In some embodiments, the passivation region 135 may have an asymmetric thickness to reduce transfer lag of image charge from the photodiode 115 to the floating diffusion region 148. The asymmetric thickness results in a thickness of the passivation region 135 disposed between the shallow doped region 116 and the vertical portion 142 of the transfer gate 140 to be less than a thickness of the passivation region 135 disposed between the floating diffusion region 148 and the vertical portion 142 of the transfer gate 140. However, it is appreciated that in other embodiments, the thickness of the passivation region 135 may be substantially uniform (e.g., as illustrated) or the passivation region 135 may be omitted, in accordance with embodiments of the disclosure.

As illustrated in FIG. 1, the vertical portion 142 of the transfer gate 140, which extends into the semiconductor substrate 102, is disposed adjacent to the shallow doped region 116. The shallow doped region 116 and the vertical portion 142 of the transfer gate 140 may be arranged to vertically overlap (e.g., disposed on or over) the deep doped region 124. In some embodiments, the vertical portion 142 extends deeper (e.g., from the first side 104 to the second side 106) into the semiconductor substrate 102 than the shallow doped region 116. In the illustrated embodiment, a first lateral separation distance 151 is disposed between the vertical portion 142 of the transfer gate 140 and the shallow doped region 116. The first lateral separation distance 151 is positioned proximate to or otherwise overlapping with a main transfer path extending between the photodiode 115 and the floating diffusion region 148 (see, e.g., FIGS. 2A-2D). In some embodiments, the first lateral separation distance 151 is smaller than any other lateral separation distance between the vertical portion 142 of the transfer gate 140 and the shallow doped region 116 (see, e.g., FIGS. 2A-2D). The main transfer path may be defined as a transfer channel path between the photodiode 115 and the floating diffusion region 148 formed by transfer gate 140 upon biasing where most photogenerated charges (e.g., electrons exit from the photodiode 115 via the shallow doped region 116) aggregate and transfer to the floating diffusion region 148. As discussed previously, it was found that image lag of an image sensor that includes the pixel cell 105 may be improved by reducing the first lateral separation distance 151. However, it was found that trench etching utilized during the formation of the vertical portion 142 may induce surface and/or interface defects and the negative consequences (e.g., increased white pixel and/or dark current for the image sensor) may be exacerbated when the vertical portion 142 of the transfer gate 140 is uniformly separated from the shallow doped region 116 and/or when the first lateral separation distance 151 reduced as the size of the pixel cell 105 is reduced. To mitigate the white pixel and/or dark current issues, the lateral area of at least the shallow doped region 116 of the photodiode 115 is configured to have a non-uniform separation distance from the vertical portion 142 (see, e.g., FIGS. 2A-3B). In other words, the layout of the shallow doped region 116 is adjusted such that the shortest distance between the shallow doped region 116 and the vertical portion 142 (e.g., proximate to the main transfer path) can be reduced to minimize image lag while the area between the shallow doped region 116 and the vertical portion 142 is increased to mitigate white pixel and/or dark current. This is achieved, at least in part, by configuring the shallow doped region 116 to include a base segment and one or more protrusions extending from the base segment such that when the photodiode 115 is viewed from a plan view (e.g., as illustrated by embodiments detailed in FIGS. 2A-4), the vertical portion 142 of the transfer gate 140 is non-uniformly separated from the shallow doped region 116, embodiments of which will be discussed in greater detail below.

Figure 2A:
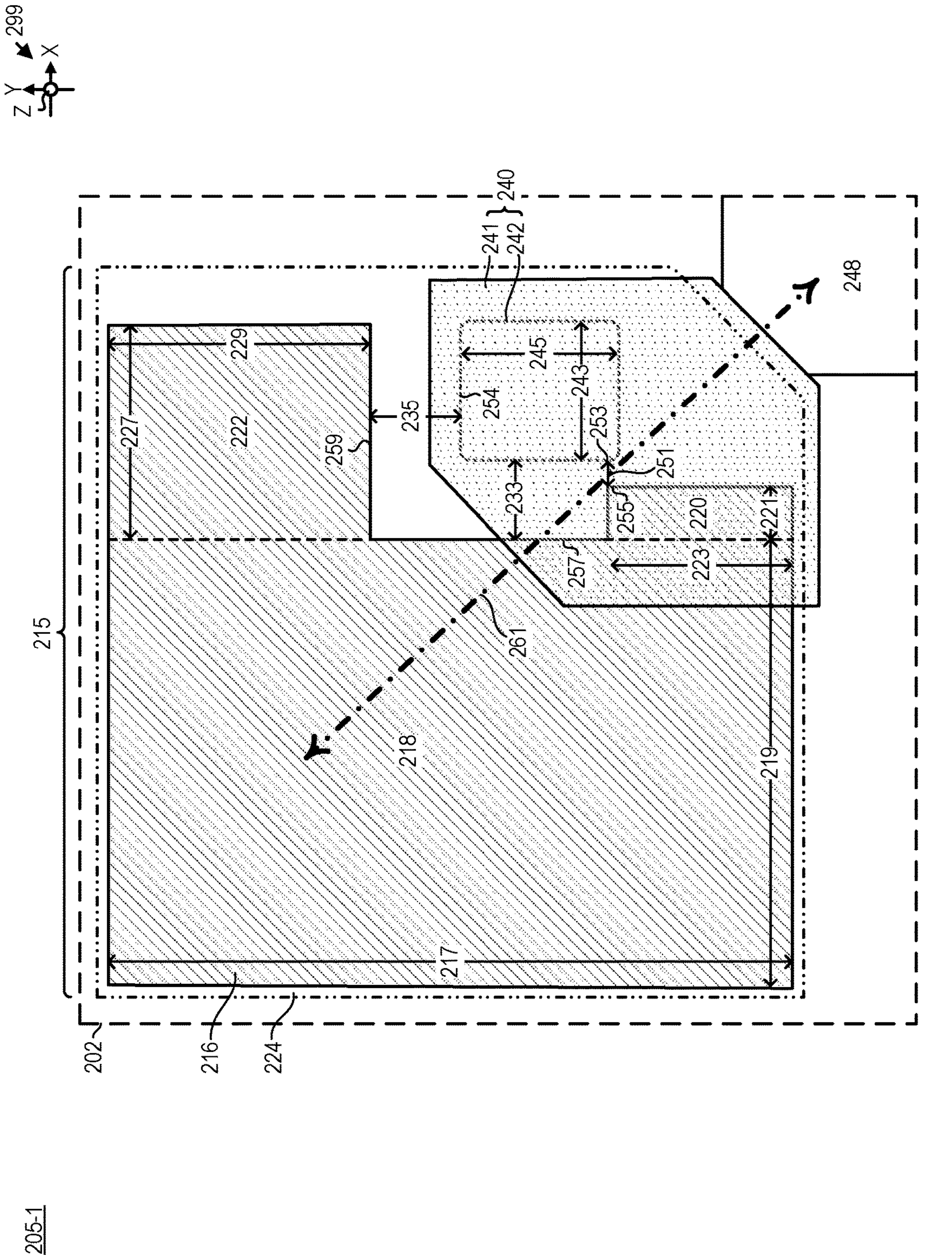
FIG. 2A illustrates a plan view of a photodiode, having at least two protrusions, included in a pixel cell of an image sensor with a vertical transfer gate, in accordance with an embodiment of the present disclosure.

FIG. 2A illustrates a plan view of a photodiode 215, having at least two protrusions (e.g., first protrusion 220 and second protrusion 222), included in a pixel cell 205-1 of an image sensor with a vertical transfer gate 240, in accordance with an embodiment of the present disclosure. The pixel cell 205-1 includes photodiode 215, transfer gate 240, and floating diffusion region 248, each formed in or on a semiconductor substrate 202. The pixel cell 205-1 is one possible implementation of the pixel cell 105 and includes many like-labeled elements. For example, the photodiode 215, which includes shallow doped region 216 and deep doped region 224, the transfer gate 240, which includes planar portion 241 and vertical portion 242, and floating diffusion region 248 of FIG. 2A may respectively correspond to the photodiode 115, which includes shallow doped region 116 and deep doped region 124, the transfer gate 140, which includes planar portion 141 and vertical portion 142, and the floating diffusion region 148 of FIG. 1. In some embodiments, vertical portion 242 may be surrounded by a region of semiconductor substrate 202 that is doped with one or more dopants having an opposite conductivity as the shallow doped region 216 to reduce dark current. That is, a doped region (e.g., passivation region 135 illustrated in FIG. 1) having an opposite conductivity as shallow doped region 216 is arranged between the shallow doped region 216 and the vertical portion 242. The doped region further surrounds the vertical portion 242 to provide surface passivation to reduce or minimize defect and result in improved dark current. It is appreciated that not all elements of the pixel cell 205-1 are necessarily included in the illustrated embodiment of FIG. 2A (e.g., features such as a gate dielectric, a pinning region, a color filter, a microlens, and the like may be omitted to avoid obscuring certain features of the disclosure). Similar to the pixel cell 105 illustrated in FIG. 1, the photodiode 215 is adapted to photogenerate image charge in response to incident light and the transfer gate 240 is adapted to transfer the image charge from the photodiode 215 to the floating diffusion region 248 along a main transfer path (e.g., along axis 261 that extends between the protrusion 220 and the vertical portion 242). In some embodiments, the axis 261 may be tangential to the vertical portion 242 of transfer gate 240. In the illustrated embodiment, the main transfer path provided by the transfer gate 240 upon biasing may be formed to extend through the lateral separation distance 251 between the protrusion 220 of the shallow doped region 216 and the vertical portion 242 of the transfer gate 240. The main transfer path is a transfer channel path between the photodiode 215 (shallow doped region 216 of the photodiode 215) and the floating diffusion region 248 formed by transfer gate 240 upon biasing where the majority of photogenerated image charges (e.g., electrons that exit from shallow doped region 216) are aggregated and transferred to the floating diffusion region 248.

Referring back to FIG. 2A, the shallow doped region 216 and the deep doped region 224 are formed in the semiconductor substrate 202. When the pixel cell 205-1 is viewed from a plan view, the shallow doped region 216 includes a base segment 218 and the protrusions 220 (e.g., the first protrusion) and 222 (e.g., the second protrusion) extending from the base segment 218. It is appreciated that there is no intermediate element disposed between the base segment 218 and the protrusions 220 and 222 as the protrusions 220 and 222 directly interface with the base segment 218. In some embodiments, the shallow doped region 216 of the photodiode 215 consists of the base segment 218, and the protrusions 220 and 222. In other embodiments, the protrusion 222 may be omitted such that the shallow doped region 216 of the photodiode 215 consists of the base segment 218 and the protrusion 220. In other embodiments, the photodiode 215 may include additional protrusions (e.g., in addition to protrusions 220 and 222) extending from the base segment 218 such that the shallow doped region 216 includes more than two protrusions. In some embodiments, the shallow doped region 216 has a "J" or "C" shape to at least partially surround (e.g., extend around at least two sides) of the vertical portion 242 of the transfer gate 240. In other words, the protrusion 222 (e.g., the second protrusion) extends from the base segment 218 opposite the protrusion 220 (e.g., first protrusion) such that the shallow doped region 216 at least partially surrounds the vertical portion 242 of the transfer gate 240. More specifically, the protrusions 220 and 222 extend to opposite ends (e.g., opposite with respect to the y-direction of the coordinate system 299) of the base segment 218 and further extend towards the vertical portion 242 of the transfer gate 240 such that the protrusions 220 and 222 each face the vertical portion 242.

As illustrated, the shallow doped region 216 is separated from the vertical portion 242 of the transfer gate by lateral separation distance 251 (e.g., a first lateral separation distance), lateral separation distance 233 (e.g., a second lateral separation distance), and lateral separation distance 235 (e.g., a third lateral separation distance). It is appreciated that the lateral separation distance 251 is different from the lateral separation distances 233 and 235. Accordingly, the shallow doped region 216 is non-uniformly separated from the vertical portion 242 of the transfer gate 240 to facilitate reduced image lag and dark current. The protrusion 220 is separated from the vertical portion 242 by the lateral separation distance 251. The base segment 218 is separated from the vertical portion 242 by the lateral separation distance 233. The protrusion 222 is separated from the vertical portion 242 by the lateral separation distance 235. It is appreciated that the lateral separation distances 253 may correspond to the smallest separation distance between the vertical portion 242 and the protrusion 220, the lateral separation distance 233 may correspond to the smallest separation distance between the vertical portion 242 and the base segment 218, and the lateral separation distance 235 may correspond to the smallest separation distance between the vertical portion 242 and the protrusion 222. In some embodiments, lateral separation distances 253, 233, and 235 are different. To configure the non-uniform separation between the shallow doped region 216 and the vertical portion 242, the protrusion 220 is positioned closer to the vertical portion 242 than either of the base segment 218 and the protrusion 222. Consequently, the lateral separation distance 251 is smaller than any other lateral separation distance, including the lateral separation distances 233 and 235, between the shallow doped region 216 and the vertical portion 242 of the transfer gate 240.

When the pixel cell 205-1 is viewed from the plan view as illustrated in FIG. 2A, a first edge 253 of the vertical portion 242 extends adjacent to a first boundary 255 of the protrusion 220. In some embodiments, the first edge 253 of the vertical portion 242 extends parallel to the first boundary 255 of the protrusion 220 (e.g., along the y-direction of the coordinate system 299). Additionally, the first edge 253 of the vertical portion 242 extends adjacent to a second boundary 257 of the base segment 218. In some embodiments, the first edge 253 of the vertical portion 242 extends parallel to the second boundary 257 of the base segment 218. In the illustrated embodiment, the first boundary 225 of the protrusion 220 and the second boundary 257 are each directly facing (e.g., without any intervening portion of the shallow doped region 216 disposed therebetween) the first edge 253 of the vertical portion 242. The vertical portion 242 of the transfer gate 240 further includes a second edge 254 perpendicular to the first edge 253. The protrusion 222 includes a third boundary 259 facing the second edge 254 such that the second edge 254 of the vertical portion 242 extends adjacent to the third boundary 259 of the protrusion 222. In some embodiments, the second edge 254 of the vertical portion 242 extends parallel to the third boundary 259 of the protrusion 222. In the illustrated embodiment, the third boundary 259 of the protrusion 222 is directly facing (e.g., without any intervening portion of the shallow doped region 216 disposed therebetween) the second edge 254 of the vertical portion 242.

In embodiments, the shallow doped region 216 is configured (e.g., via doping and implant depth) as a connection portion of the photodiode 215 for connecting the deep doped region 224 to a transfer channel provided by transfer gate 240 and the deep doped region 224 may be formed to configure a full well capacity for the photodiode 215 to accumulate photogenerated image charges in response to incident light. As illustrated, the deep doped region 224 of the photodiode 215 may have a greater lateral area than a combined lateral area of the shallow doped region 216 and the vertical portion 242 of the transfer gate 240 to increase full well capacity of the photodiode 215. The transfer gate 240 further includes the planar portion 241 coupled to the vertical portion 242. It is appreciated that the first side of the semiconductor substrate 202 (e.g. corresponding to the first side 104 of the semiconductor substrate 102 illustrated in FIG. 1) is disposed between the planar portion 241 and the protrusion 220 of the shallow doped region 216. In other words, the planar portion 241 may be arranged to overlap the protrusion 220 in a depthwise direction (e.g., z-direction of the coordinate system 299). In the illustrated embodiment of FIG. 2A, the planar portion 241 entirely covers the protrusion 220 and does not cover or otherwise overlap with the protrusion 222. In some embodiments, a doping concentration of the shallow doped region 216 is greater than the deep doped region 224. In some embodiments, the doping profile of photodiode 215 is a gradient doping profile in a depthwise direction. In some embodiments, the doping concentration of the shallow doped region 216 proximate to axis 261 that extends between the protrusion 220 and the vertical portion 242 is greater than other regions of the shallow doped region 216. In other words, doping of the shallow doped region 216 may be greatest proximate to the smallest lateral separation distance between the vertical portion 242 and the shallow doped region 216 (e.g., lateral separation distance 251) to facilitate charge transfer (e.g., by increasing the electric field for the region of shallow doped region 216 of the photodiode 215 close to the main transfer path between photodiode 215 and floating diffusion region 248). In some embodiments, a first doping concentration of the protrusion 220 included in the shallow doped region 216 proximate to the vertical portion 242 of the transfer gate 240 is greater than a second doping concentration of the base segment 218 to facilitate charge transfer while reducing dark current and white pixel. In some embodiments, the first doping concentration is at least 10%, 15%, 20% and at most about 25% greater than the second doping concentration.

In the illustrated embodiment, the base segment 218 is defined by dimensions 217 and 219 (e.g., length or width, respectively, or vice versa), the protrusion 220 is defined by dimensions 221 and 223 (e.g., length or width, respectively, or vice versa), and the protrusion 222 is defined by dimensions 227 and 229 (e.g., length or width, respectively, or vice versa). Dimensions 217, 223, and 229 are parallel. Dimensions 219, 221, and 227 are parallel. In the illustrated embodiment, dimension 221 is less than dimensions 219 and 227 while dimension 219 is greater than dimension 227. Similarly, dimension 223 is less than dimensions 217 and 229 while dimension 217 is greater than dimension 229. In other words, the base segment 218 is longer and/or wider than the protrusions 220 and 222. The vertical portion 242 is defined by dimensions 243 and 245 (e.g., length or width, respectively, or vice versa), which may be equal or different. In some embodiment, the vertical portion 242 is a pillar shaped.

Figure 2B:
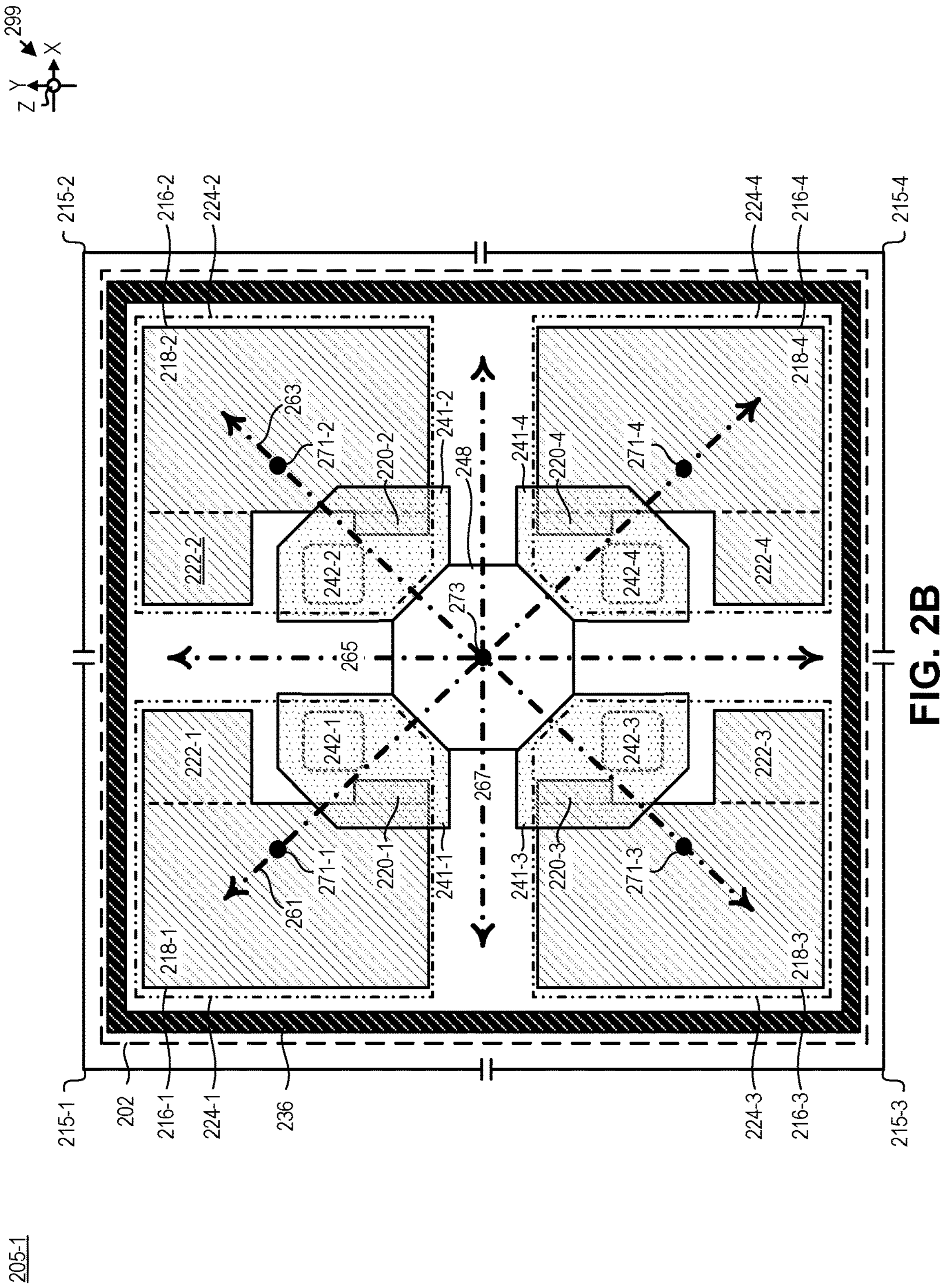
FIG. 2B illustrates an expanded plan view of the pixel cell illustrated in FIG. 2A, in accordance with an embodiment of the present disclosure.

FIG. 2B illustrates an expanded plan view of the pixel cell 205-1 illustrated in FIG. 2A, in accordance with an embodiment of the present disclosure. The pixel cell 205-1 includes a plurality of photodiodes including photodiodes 215-1, 215-2, 215-3, and 215-4 arranged in a two-by-two array of photodiodes that laterally surround the floating diffusion region 248 and are each electrically coupled to the floating diffusion region 248 via respective transfer gates (e.g., a transfer gate of the photodiode 215-1 including planar portion 241-1 and vertical portion 242-1, a transfer gate associated with the photodiode 215-2 including planar portion 241-2 and vertical portion 242-2, a transfer gate associated with the photodiode 215-3 including planar portion 241-3 and vertical portion 242-3, a transfer gate associated with the photodiode 215-4 including planar portion 241-4 and vertical portion 242-4). Each of the plurality of photodiodes (e.g., 215-1, 215-2, 215-3, and 215-4) correspond to instances of the photodiode 215 illustrated in FIG. 2A and include corresponding like-labeled elements. For example, photodiode 215-1 of FIG. 2B may correspond to photodiode 215 illustrated in FIG. 2A while photodiodes 215-2, 215-3, and 215-4 of FIG. 2B correspond to additional instances of the photodiode 215 illustrated in FIG. 2A. It is appreciated that the suffix of elements in FIG. 2B indicate an association with a given one of the photodiodes 215-1, 215-2, 215-3, or 215-3. For example, photodiode 215-1 includes shallow doped region 216-1 having a base segment 218-1, first protrusion 220-1, and second protrusion 222-1, deep doped region 224-1, and a transfer gate including planar portion 241-1 and vertical portion 242-1 that respectively correspond to the shallow doped region 216, including the base segment 218, the protrusion 220, and the protrusion 222, the deep doped region 224, and the transfer gate 240 including the planar portion 241 and the vertical portion 242 of FIG. 2A. The deep doped region 224 is located at a depth greater than the shallow doped region 216 with respect to front side 104 of semiconductor substrate 102. Accordingly, the respective shallow doped regions (e.g., 216-2, 216-3, and 216-4) of the three additional photodiodes (e.g., 215-2, 215-3, and 215-4) each include a respective base segment (e.g., 218-2, 218-3, and 218-4), first protrusion (e.g., 220-2, 220-3, and 220-4), and second protrusion (e.g., 222-2, 222-3, and 222-4). Similarly, the three additional photodiodes (e.g., 215-2, 215-3, and 215-4) each include a deep doped region (e.g., 224-2, 224-3, and 224-4). The transfer gate associated with the photodiode 215-1 includes the planar portion 241-1 and the vertical portion 242-2 that respectively correspond to the transfer gate 240 illustrated in FIG. 2A. The pixel cell 205-1 further includes three additional transfer gates, each including a respective vertical portion (e.g., 242-2, 242-3, and 242-4) extending into the semiconductor substrate 202 and respective planar portion (e.g., 241-2, 241-3, and 241-4) disposed proximate to the first side of the semiconductor substrate 202. The three additional transfer gates respectively couple the three additional photodiodes (e.g., 215-2, 215-3, and 215-4) to the floating diffusion region 248.

In some embodiments, the pixel cell 205-1 is configured to have mirror symmetry about one or more axes (e.g., axis 265 and/or axis 267). In the illustrated embodiment, the pixel cell 205-1 is configured to have two axes of mirror symmetry. For example, the pixel cell 205-1 is mirror symmetric about axis 265 and axis 267, which are perpendicular to one another. In some embodiments, the plurality of photodiodes (e.g., 215-1, 215-2, 215-3, and 215-4) and the plurality of transfer gates (e.g., the vertical portions 242-1, 242-2, 242-3, and 242-4 and/or the planar portions 241-1, 241-2, 241-3, and 241-4) are arranged around the floating diffusion region 248 such that there is mirror symmetry about two perpendicular axes (e.g., the axes 265 and 267) when the pixel cell 205-1 is viewed from the plan view (e.g., as illustrated in FIG. 2B). Accordingly, the mirror symmetry of the pixel cell 205-1 includes at least the photodiode (e.g., 215-1), the three additional photodiodes (e.g., 215-2, 215-3, and 215-4), the transfer gate (e.g., planar portion 241-1 and/or vertical portion 242-1), and the three additional transfer gates (e.g., planar portions 241-2, 241-3, and 241-4 and/or the vertical portions 242-2, 242-3, and 242-4). More specifically, in some embodiments, the mirror symmetry includes the shallow doped regions 216-1, 216-2, 216-3, and 216-4 including the corresponding base segment (e.g., 218-1, 218-2, 218-3, and 218-4) and protrusions (e.g., first protrusions 220-1, 220-2, 220-3, and 220-4 and/or second protrusions 222-1, 222-2, 222-3, and 222-4). In the same or other embodiments, the mirror symmetry further includes the deep doped regions 224-1, 224-2, 224-3, and 224-4.

As illustrated in FIG. 2B, the shallow doped region (e.g., 216-1, 216-2, 216-3, or 216-4) of at least one of the photodiodes (e.g., 215-1, 215-2, 215-3, or 215-4), the vertical portion (e.g., 242-1, 242-2, 242-3, or 242-4) of the transfer gate, and/or the floating diffusion region 248 are collectively configured such that an axis (e.g., axis 261 and/or axis 263) extending through both a center of shallow doped region (e.g., 271-1, 271-2, 271-3, and 271-4) and a center of the floating diffusion region 273 is tangential to the vertical portion (e.g., 242-1, 242-2, 242-3, or 242-4) of the respective transfer gate to facilitate transfer of photogenerated image charge from the plurality of photodiodes (e.g., 215-1, 215-2, 215-3, and 215-4) to the floating diffusion region 248, which increases transfer efficiency by reducing transfer lag. In such a configuration, the main transfer path from each of the plurality of photodiodes 214-1, 214-2, 314-3, 214-4 to the floating diffusion region 248 extends through the shortest lateral separation distance between an edge boundary of the shallow doped region (e.g., 216-1, 216-2, 216-3, and 216-4) and the vertical portion (e.g., 242-1, 242-2, 242-3, or 242-4) of the transfer gate relative to lateral separation distances between other portions of the shallow doped region (e.g., 216-1, 216-2, 216-3, and 216-4) of each of the photodiodes (e.g., 215-1, 215-2, 215-3, and 215-4) and the vertical portion (e.g., 242-1, 242-2, 242-3, or 242-4), which increases the electric coupling between the main transfer path and the shallow doped region (e.g., 216-1, 216-2, 216-3, and 216-4) of photodiode (e.g., 215-1, 215-2, 215-3, and 215-4) while minimizes coupling or interfacing of other parts of the shallow doped region distal to (e.g., away from) the main transfer path. It is appreciated that the aforementioned feature, in combination with the passivation doping (e.g., opposite conductivity doping relative to the shallow doped region disposed around the vertical portions (e.g., 242-1, 242-2, 242-3, or 242-4) results in reduced image lag and dark current.

The pixel cell 205-1 further includes an isolation structure 236 (e.g., a shallow trench isolation structure and/or a deep trench isolation structure) to provide electrical and, optionally, optical isolation of the pixel cell 205-1 from adjacent pixel cells included in a pixel cell array. In other words, the pixel cell 205-1 corresponds to an individual pixel cell included in a plurality of pixel cells arranged to form a pixel cell array. In some embodiments, each of the pixel cells included in the pixel cell array may correspond to instances of the pixel cell 205-1 having the same or different color filters (e.g., four instances of the pixel cell 205-1 may be arranged in a two-by-two array to form a full color image pixel including one red pixel cell, one blue pixel cell, and two green pixel cells).

Figure 2C:
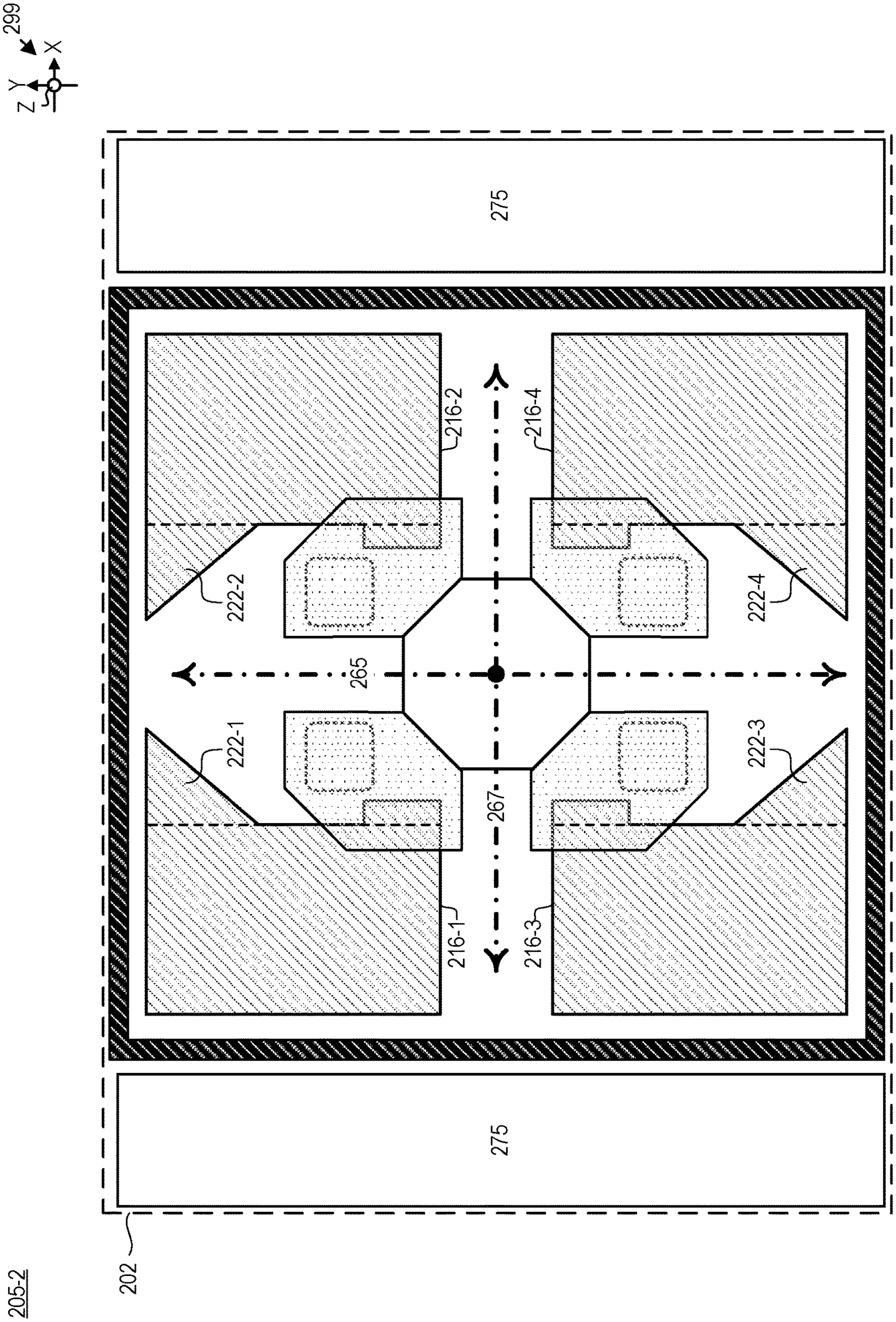
FIG. 2C illustrates a plan view of an alternative pixel cell included in an image sensor with a vertical transfer gate, in accordance with an embodiment of the present disclosure.

FIG. 2C illustrates a plan view of an alternative pixel cell 205-2 included in an image sensor with a vertical transfer gate, in accordance with an embodiment of the present disclosure. The alternative pixel cell 205-2 of FIG. 2C is similar in many regards to the pixel cell 205-1 illustrated in FIG. 2B and thus includes many of the same or similar features labeled or otherwise. For the sake of brevity, identical elements included in both the pixel cell 205-1 of FIG. 2B and the alternative pixel cell 205-2 are not necessarily labeled or illustrated. One difference between the pixel cell 205-1 of FIG. 2B and the alternative pixel cell 205-2 is that the protrusions 222-1, 222-2, 222-3, and 222-4 of the shallow doped regions 216-1, 216-2, 216-3, and 216-4 have been cut away to have a triangular shape. The protrusions 222-1, 222-2, 222-3, and 222-4 decrease in width as the protrusion extends away from the base segment (e.g., non-uniform width) reducing overlapping area between the shallow doped region (e.g., the shallow doped regions 216-1, 216-2, 216-3, and 216-4) and respective vertical portions (e.g., 242-1, 242-2, 242-3, and 242-4). More specifically, the protrusions 222-1, 222-2, 222-3, and 222-4 decrease in width as the protrusion extends away from the base segment (e.g., non-uniform width) reducing an overlapping or coupling area between the shallow doped region (shallow doped regions 216-1, 216-2, 216-3, and 216-4) and the passivation region (see, e.g., FIG. 1) disposed around respective vertical portions (e.g., 242-1, 242-2, 242-3, or 242-4). However, it is appreciated that the alternative pixel cell 205-2 still maintains the mirror symmetry about the axes 265 and 267. Another difference is the expanded plan view of FIG. 2C also illustrates circuitry 275 (e.g., pixel control circuitry such as a source-follower transistor, reset transistor, row select transistor, other circuitry elements such as memory elements, or combinations thereof) to facilitate operation of the alternative pixel cell 205-2. The circuitry 275 may include source/drain regions (e.g., doped regions of the semiconductor substrate 202), gate electrodes (e.g., polycrystalline silicon), gate dielectrics (e.g., silicon dioxide, hafnium dioxide, other insulating materials, or combinations thereof). It is further appreciated that the pixel cell 205-1 of FIG. 2B may also include the circuitry 275 of FIG. 2C.

Figure 2D:
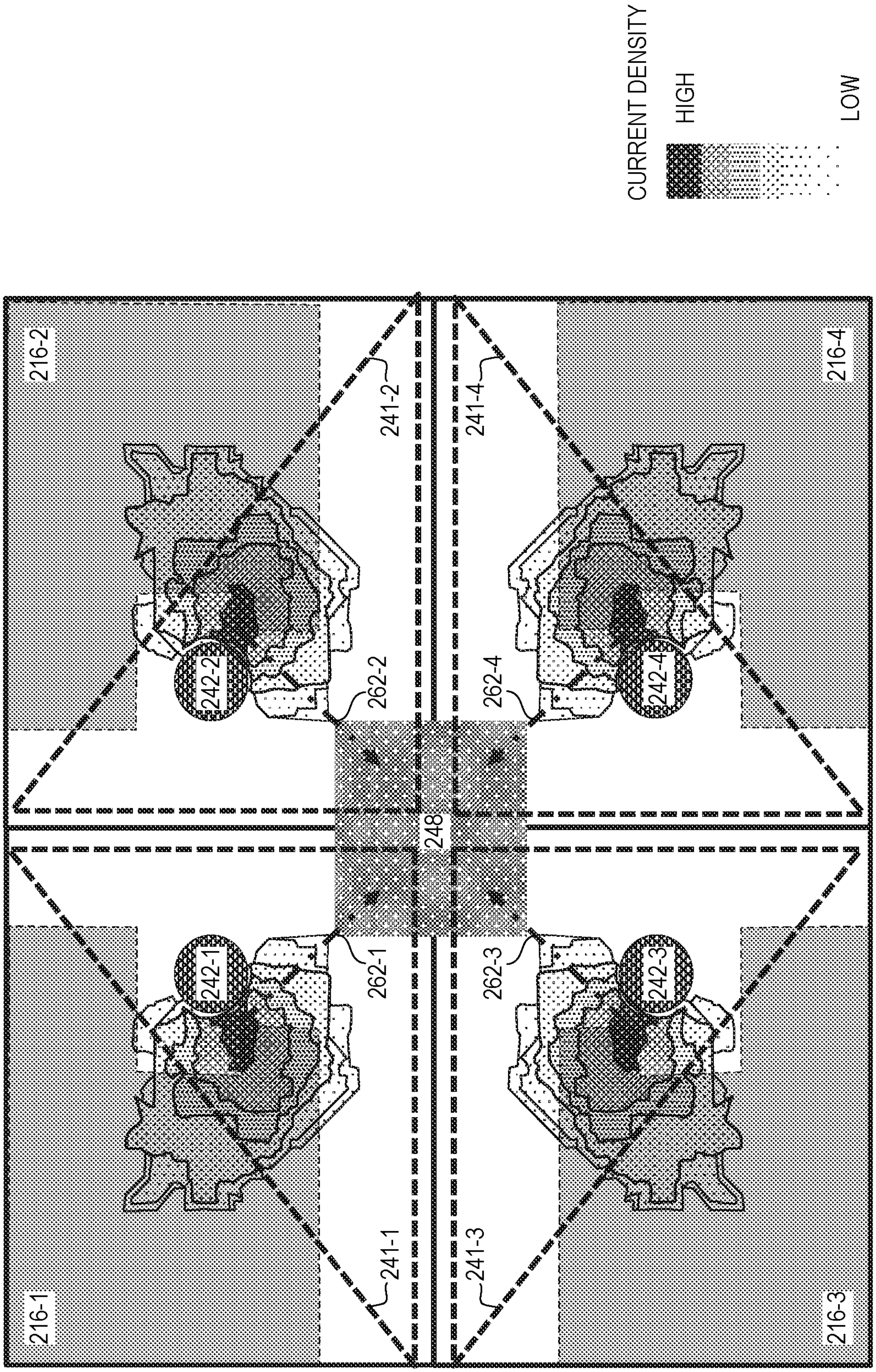
FIG. 2D illustrates a simulation showing current density showing a main transfer path for a pixel cell included in an image sensor with a vertical transfer gate, in accordance with an embodiment of the disclosure.

FIG. 2D illustrates a simulation showing current density showing a main transfer path (e.g., 262-1, 262-2, 262-3, and 262-4) for a pixel cell (e.g., the pixel cell 205-1 and/or 205-2 illustrated in FIGS. 2A-2C) included in an image sensor with a vertical transfer gate, in accordance with an embodiment of the disclosure. The simulation illustrated in FIG. 2D is representative of the pixel cell 205-1 and the alternative pixel cell 205-2 and thus includes shallow doped regions 216-1, 216-2, 216-3, and 216-4, transfer gates including planar portions 241-1, 241-2, 241-3, and 241-4 and vertical portions 242-1, 242-2, 242-3, and 242-4, and floating diffusion region 248 that are similarly labeled in FIGS. 2A-2C. The simulation shows that the configurations disclosed in embodiments of the disclosure result in the main transfer paths 262-1, 262-2, 262-3, and 262-4 extending through the shortest lateral separation distance between the shallow doped region and the vertical portion of the transfer gate and further shows increased current density proximate to the shortest separation distance, which results in reduced image lag and dark current.

It is appreciated that the views presented in FIGS. 2A-2D may omit certain features of embodiments of an image sensor including the pixel cells 205-1 and/or 205-2, to avoid obscuring details of the disclosure. In other words, not all elements of the pixel cells 205-1 and/or 205-2 may be labeled, illustrated, or otherwise shown within FIGS. 2A-2D or other figures throughout the disclosure. It is further appreciated that in some embodiments, the pixel cells 205-1 and/or 205-2 may not necessarily include all elements shown. For example, the pixel cell 205-1 illustrated in FIG. 2B shows a two-by-two array of photodiodes (e.g., 215-1, 215-2, 215-3, and 215-4), but in other embodiments a configuration with additional or fewer photodiodes may be utilized. For example, there may be 1, 2, 4, 8, 16, or any other amount of photodiodes included in the pixel cell 205-1.

Figure 3A:
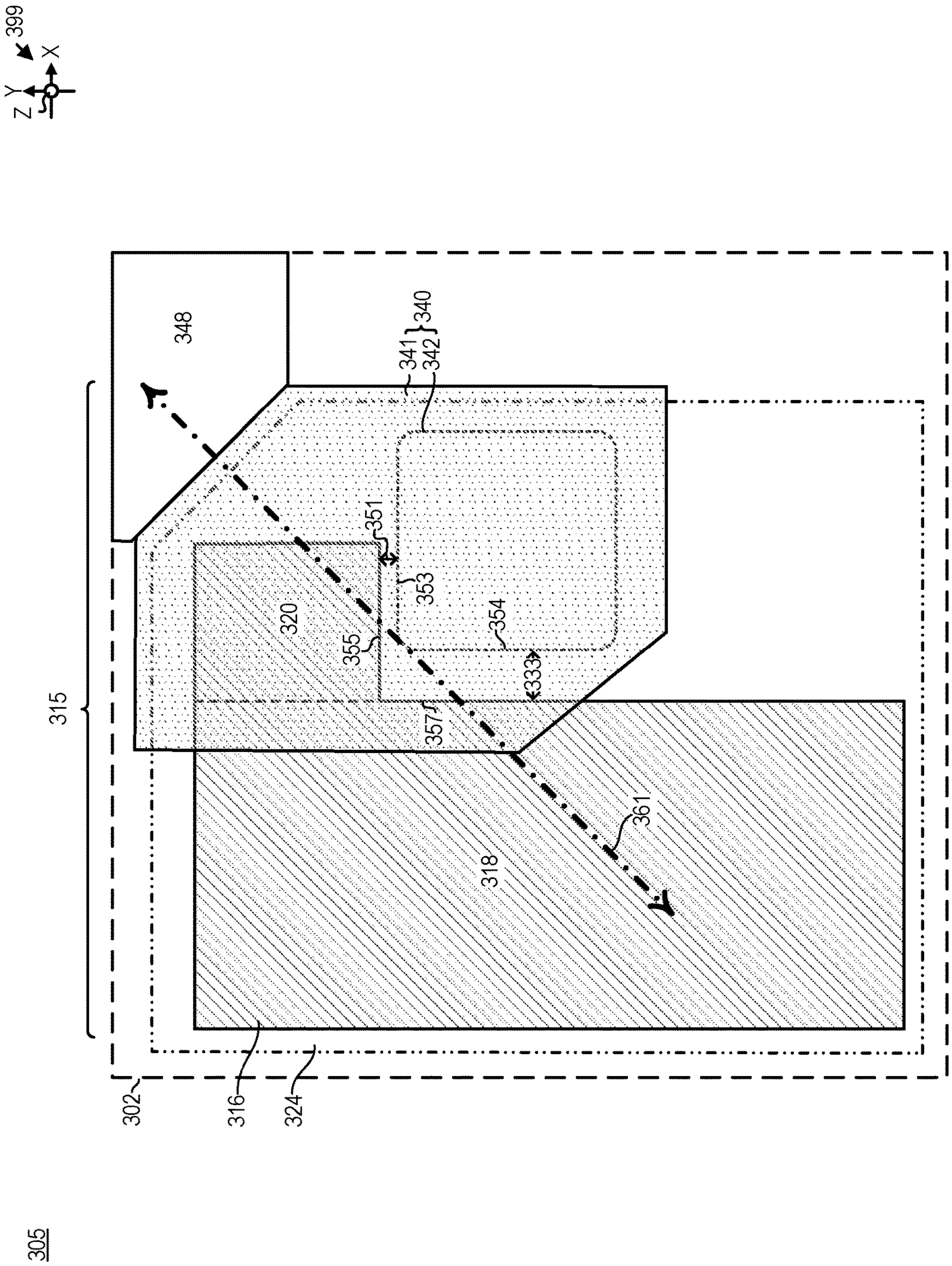
FIG. 3A illustrates a plan view of a photodiode, having at least one protrusion, included in a pixel cell of an image sensor with a vertical transfer gate, in accordance with an embodiment of the present disclosure.

FIG. 3A illustrates a plan view (e.g., along the x-y plane of the coordinate system 399) of a photodiode 315, having at least one protrusion 320, included in a pixel cell 305 of an image sensor with a vertical transfer gate (e.g., transfer gate 340), in accordance with an embodiment of the present disclosure. The pixel cell 305 is similar in many regards to the pixel cells 205-1 and 205-2 illustrated in FIGS. 2A-2C and includes similar features, of which many are labeled. The pixel cell 305 is also one possible implementation of the pixel cell 105 illustrated in FIG. 1 and includes many like-labeled elements. The pixel cell 305 includes the photodiode 315, the transfer gate 340, and the floating diffusion region 348, each formed in or on a semiconductor substrate 302. The photodiode 315, which includes shallow doped region 316 and deep doped region 324, the transfer gate 340, which includes planar portion 341 and vertical portion 342, and the floating diffusion region 348 of FIG. 3A may respectively correspond to the photodiode 115, which includes shallow doped region 116 and deep doped region 124, the transfer gate 140, which includes planar portion 141 and vertical portion 142, and the floating diffusion region 148 of FIG. 1. It is appreciated that not all elements of the pixel cell 305 are necessarily included in the illustrated embodiment of FIG. 3A (e.g., features such as a gate dielectric, a pinning region, a color filter, a microlens, and the like may be omitted to avoid obscuring certain features of the disclosure). Similar to the pixel cell 105 illustrated in FIG. 1, the photodiode 315 illustrated in FIG. 3A is adapted to photogenerate image charge in response to incident light and the transfer gate 340 is adapted to transfer the image charge from the photodiode 315 to the floating diffusion region 348 along a main transfer path (e.g., along axis 361 that extends between the protrusion 320 and the vertical portion 342). In the illustrated embodiment, the main transfer path extends through the lateral separation distance 351 between the protrusion 320 of the shallow doped region 316 and the vertical portion 342 of the transfer gate 340.

In the illustrated plan view, the shallow doped region 316 includes a base segment 318 and the protrusion 320 extending from the base segment 318. The protrusion 320 is separated from the vertical portion 342 by the lateral separation distance 351 (e.g., a first lateral separation distance) and the base segment 318 is separated from the vertical portion 342 by lateral separation distance 333 (e.g., a second lateral separation distance) different from the lateral separation distance 351 such that the there is a non-uniform separation distance between the shallow doped region 316 and the vertical portion 342. In the illustrated embodiment, the lateral separation distance 351 is smaller than any other lateral separation distance, including the lateral separation distance 333, between the vertical portion 342 of the transfer gate 340 and the shallow doped region 316. In some embodiments, the shallow doped region 316 consists of the base segment 318 and the protrusion 320.

As illustrated in the plan view of FIG. 3A, a first edge 353 of the vertical portion 342 of the transfer gate 340 extends adjacent to a first boundary 355 of the protrusion 320 while a second edge 354 of the vertical portion 342 of the transfer gate 340 extends adjacent to a second boundary 357 of the base segment 318 of the shallow doped region 316. In other words, the first edge 353 and the second edge 354 of the vertical portion 342 respectively face the first boundary 355 of the protrusion 320 and the second boundary 357 of the base segment 318 without any intervening portion of the shallow doped region 316 disposed therebetween. In the illustrated embodiment, the first edge 353 is perpendicular to the second edge 354 such that the shallow doped region 316 forms an "L" shape that extends around the vertical portion 342 of the transfer gate 340. To increase full well capacity of the photodiode 315, the deep doped region 324 of the photodiode 315 has a greater lateral area than a combined lateral area of the shallow doped region 316 and the vertical portion 342 of the transfer gate 340.

Figure 3B:
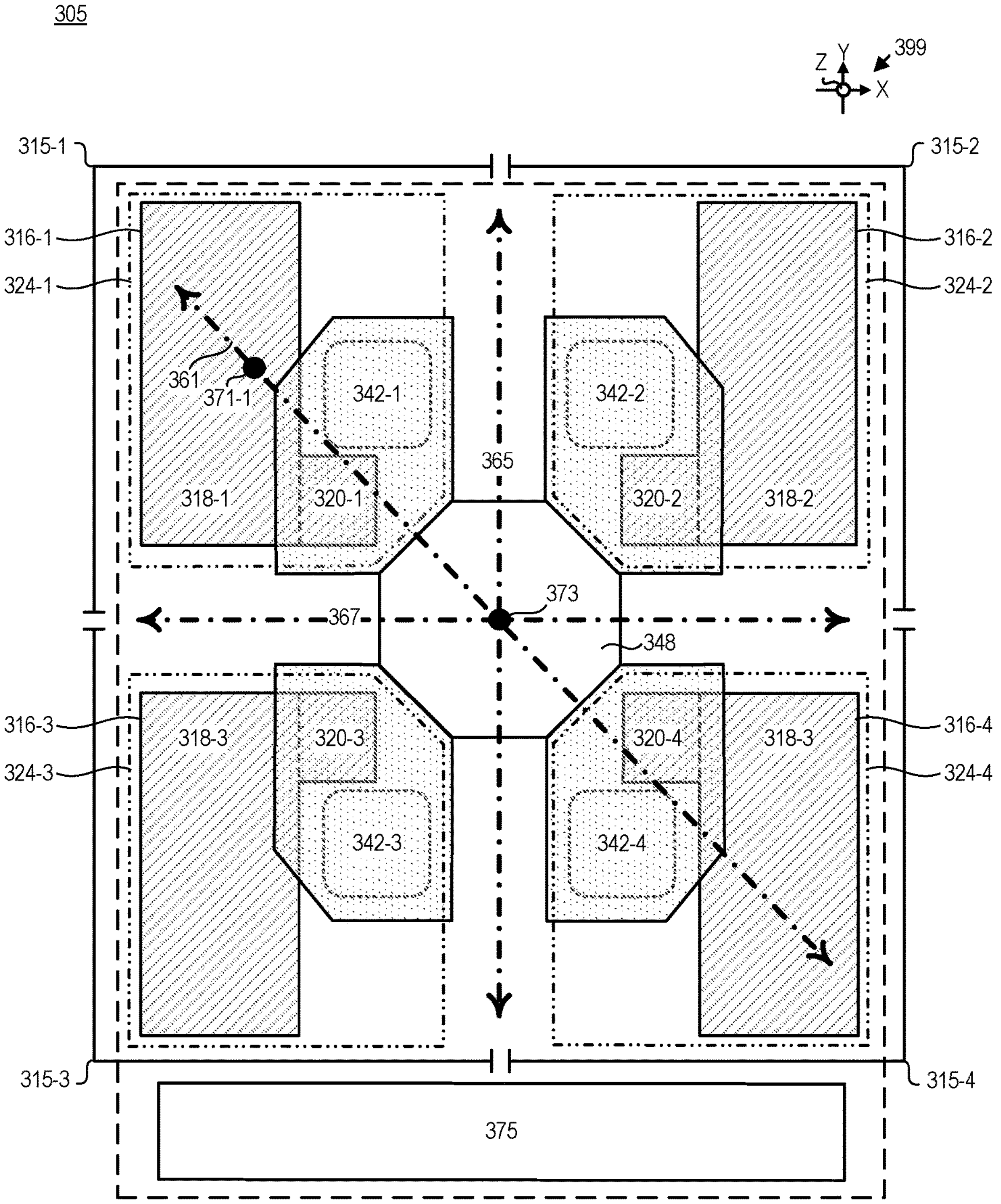
FIG. 3B illustrates an expanded plan view of the pixel cell illustrated in FIG. 3A, in accordance with an embodiment of the disclosure.

FIG. 3B illustrates an expanded plan view of the pixel cell 305 illustrated in FIG. 3A, in accordance with an embodiment of the disclosure. The pixel cell 305 includes a plurality of photodiodes (e.g., 315-1, 315-2, 315-3, and 315-4) that correspond to respective instances of the photodiode 315 illustrated in FIG. 3A. For example, the photodiode 315-1 of FIG. 3B may correspond to the photodiode 315 of FIG. 3A and the photodiodes 315-2, 315-3, and 315-4 of FIG. 3B may correspond to three additional photodiodes (e.g., additional instances) of the photodiode 315 that are collectively arranged to laterally surround floating diffusion region 348 and are each electrically coupled to the floating diffusion region 348. Accordingly, the shallow doped regions 316-1, 316-2, 316-3, and 316-4 of the photodiodes 315-1, 315-2, 315-3, and 315-4 each include a respective base segment 318-1, 318-2, 318-3, and 318-4 and respective protrusion 320-1, 320-2, 320-3, and 320-4 extending from the respective base segment 318-1, 318-2, 318-3, and 318-4. The pixel cell 305 further includes transfer gates that respectively couple the photodiodes 315-1, 315-2, 315-3, and 315-4 to the floating diffusion region 348 to facilitate transfer of image charge from the photodiodes 315-1, 315-2, 315-3, and 315-4 to the floating diffusion region 348. The transfer gates each include respective planar portions 341-1, 341-2, 341-3, and 341-4 disposed proximate to a first side (e.g., the first side 104 illustrated in FIG. 1) of the semiconductor substrate 302 and vertical portions 342-1, 342-2, 342-3, and 342-4 extending into the semiconductor substrate 302.

As illustrated in FIG. 3B, the pixel cell 305 is configured to facilitate transfer of image charge from the photodiodes 315-1, 315-2, 315-3, and 315-4 to the floating diffusion region 348 along respective main transfer paths that extends between the protrusions 320-1, 320-2, 320-3, and 320-4 and the vertical portions 342-1, 342-2, 342-3, and 342-3 of the transfer gates. The pixel cell 305 is further configured to facilitate transfer of the image charge based on the positioning, size, and arrangement of elements of the photodiodes 315-1, 315-2, 315-3, and 315-4. For example, the shallow doped region 316-1 of the photodiode 315-1, and the vertical portion 342-1 of the transfer gate, and the floating diffusion region 348 are collectively configured such an axis 361 extending through both a center 371-1 of the shallow doped region 316-1 and a center 373 of the floating diffusion region 348 is tangential to the vertical portion 342-1 of the transfer gate. In the illustrated embodiment, components of the photodiodes 315-2, 315-3, and 315-4 are similarly arranged. Additionally, the plurality of photodiodes (e.g., 315-1, 315-2, 315-3, and 315-4) and the plurality of transfer gates (e.g., the unlabeled planar portions and/or the vertical portions 342-1, 342-2, 342-3, and 342-4) are arranged around the floating diffusion region 348 such that there is mirror symmetry about two perpendicular axes (e.g., axis 365 and axis 367) when the pixel cell 305 is viewed from the plan view. The pixel cell 305 also includes circuitry 375 (e.g., pixel control circuitry such as a source-follower transistor, reset transistor, row select transistor, other circuitry elements such as memory elements, or combinations thereof) to facilitate operation of the pixel cell 305 disposed adjacent to photodiodes 315-3 and 315-4. The circuitry 375 may include source/drain regions (e.g., doped regions of the semiconductor substrate 302), gate electrodes (e.g., polycrystalline silicon), gate dielectrics (e.g., silicon dioxide, hafnium dioxide, other insulating materials, or combinations thereof). It is appreciated that the view provided by FIG. 3B may represent a unit of the image sensor that is repeated in the x- and y- directions of the coordinate system 399 to form a pixel cell array of an image sensor.

It is appreciated that the views presented in FIGS. 3A-3B may omit certain features of embodiments of an image sensor including the pixel cell 305 to avoid obscuring details of the disclosure. In other words, not all elements of the pixel cell 305 may be labeled, illustrated, or otherwise shown within FIGS. 3A-3B or other figures throughout the disclosure. It is further appreciated that in some embodiments, the pixel cell 305 may not necessarily include all elements shown. For example, the pixel cell 305 illustrated in FIG. 3B shows a two-by-two array of photodiodes (e.g., 315-1, 315-2, 315-3, and 315-4), but in other embodiments a configuration with additional or fewer photodiodes may be utilized. For example, there may be 1, 2, 4, 8, 16, or any other amount of photodiodes included in the pixel cell 305.

It is further appreciated when viewed from a plan view (e.g., as illustrated in FIG. 2A-3B), elements are located on different z-positions of a given coordinate system (e.g., coordinate systems 299 and 399, which may be representative of a different view of the coordinate system 199 illustrated in FIG. 1) but are otherwise optically aligned. For example, protrusion 220 of the shallow doped region 216, deep doped region 224, and planar portion 241 of the transfer gate 240 are each located on different planes (e.g., different z-positions of the coordinate system 299). FIG. 2A shows the aforementioned elements as optically aligned or otherwise disposed over one another even though there may be a vertical separation distance between the aforementioned elements. For example, planar portion 242 of the transfer gate 240 illustrated in FIG. 2A does not directly contact the shallow doped region 216 and the deep doped region 224 (e.g., as shown in FIG. 1). Accordingly, it is appreciated that references to terms like "lateral area" or "separation distance" or the like are in reference to a planar projection or similar view (e.g., a planar projection onto an x-y plane based on the coordinate system 299).

Figure 4:
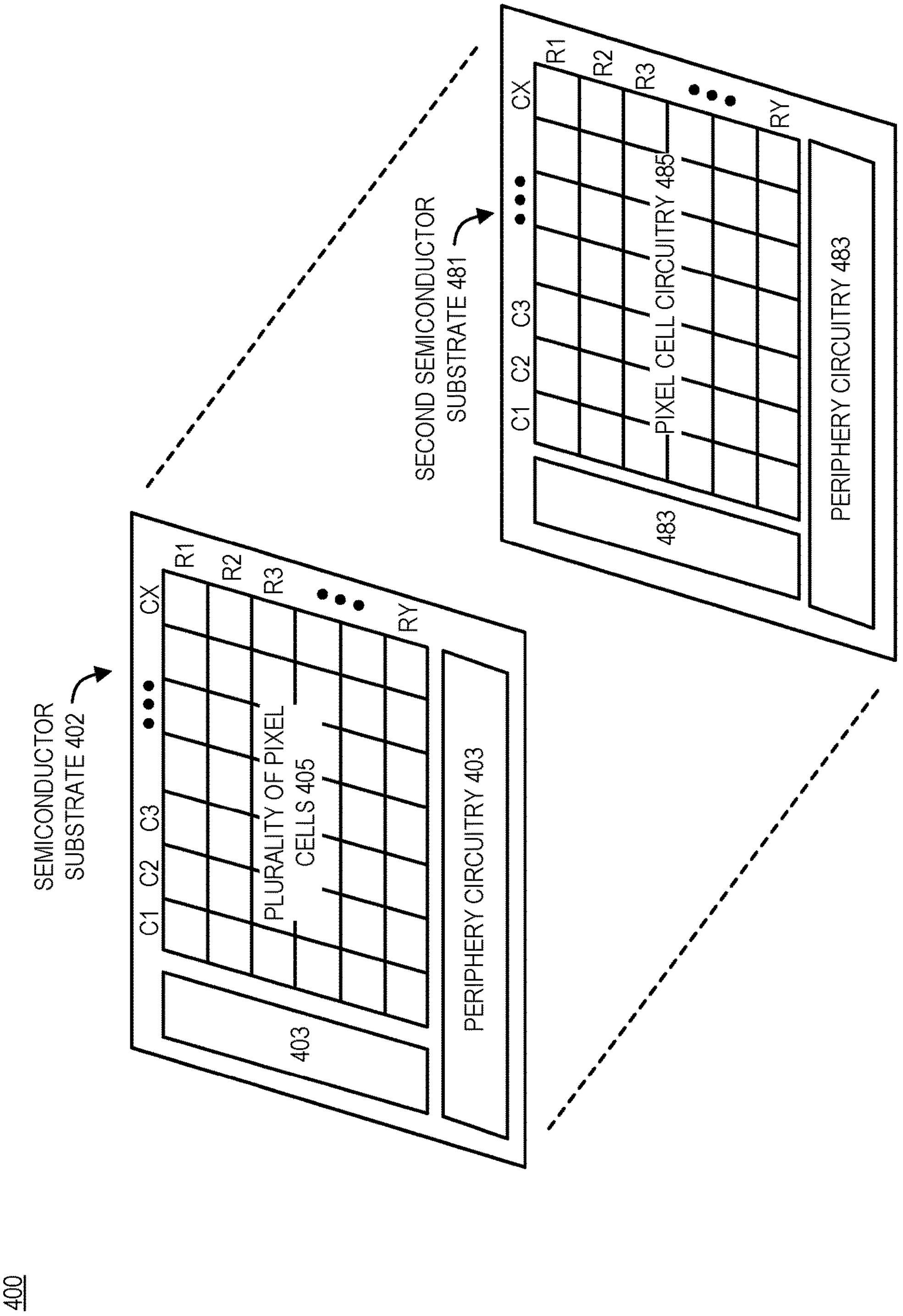
FIG. 4 illustrates a stacked image sensor including a plurality of pixel cells, each pixel cell including a vertical transfer gate, in accordance with an embodiment of the disclosure.

FIG. 4 illustrates a stacked image sensor 400 including a plurality of pixel cells 405, each pixel cell including a vertical transfer gate, in accordance with an embodiment of the disclosure. The stacked image sensor 400 includes semiconductor substrate 402 and second semiconductor substrate 481, each of which may correspond to a part of or an entirety of a semiconductor wafer in accordance with embodiments of the disclosure. The semiconductor substrate 402 includes a plurality of pixel cells 405 arranged in rows (e.g., R1, R2, R3, and so on) and columns (e.g., C1, C2, C3, and so on). Each pixel cell included in the plurality of pixel cells 405 may be representative of the pixel cells discussed in various embodiments of the disclosure (e.g., pixel cells 105, 205-1, 205-2, 305, or combinations thereof). The semiconductor substrate 402 includes periphery circuitry 403, which may include, but is not limited to, row and column decoders and drivers, analog signal processing chains, digital imaging processing blocks, memory, timing and control circuits, input/output interfaces, a vertical scanner, sample and hold circuitry, amplifiers, analog-to-digital converter circuitry, and any other embodiments of logic and/or circuitry that is appropriate for the function of the image sensor 400.

In the illustrated embodiment of FIG. 4, the stacked image sensor 400 is a stacked complementary metal-oxide semiconductor (CMOS) device formed, at least in part, by the semiconductor substrate 401 (e.g., a first die) and the second semiconductor substrate 451 (e.g., a second die) that are stacked and coupled together (e.g., electrically and/or physically) in a stacked chip scheme achieved via bonding (e.g., oxide bonding, metal bonding, hybrid bonding), silicon connections (e.g., through silicon vias), other suitable circuit coupling technologies, or combinations thereof. Additionally, it is appreciated that the view presented in FIG. 4 may omit certain elements of the stacked image sensor 400 to avoid obscuring details of the disclosure. In other words, not all elements of the stacked image sensor 400 may be labeled, illustrated, or otherwise shown within FIG. 4 or other figures throughout the disclosure.

The stacked chip scheme of the stacked image sensor 400 illustrated in FIG. 4 distributes components across multiple substrates. Specifically, the first semiconductor substrate 401 includes photosensitive elements (e.g., photodiodes included in the plurality of pixel cells 405) while the second semiconductor substrate 481 includes pixel cell circuitry 455 associated with the plurality of pixel cells 405 (e.g., any one of or a combination of pixel transistors such as reset transistors, source-follower transistors, row select transistors, switchable conversion gain transistors, and so on, analog to digital circuitry, signal processing circuitry, or other circuitry to facilitate imaging an external scene with the plurality of pixel cells 405). Put in another way, the second semiconductor substrate 481 offloads at least part of the circuitry associated with the plurality of pixel cells 405 from the semiconductor substrate 402, which advantageously provides additional space on the semiconductor substrate 402 (e.g., to reduce pixel pitch, increase photodiode sensing area relative to total pixel area, and so on).

Figure 5:
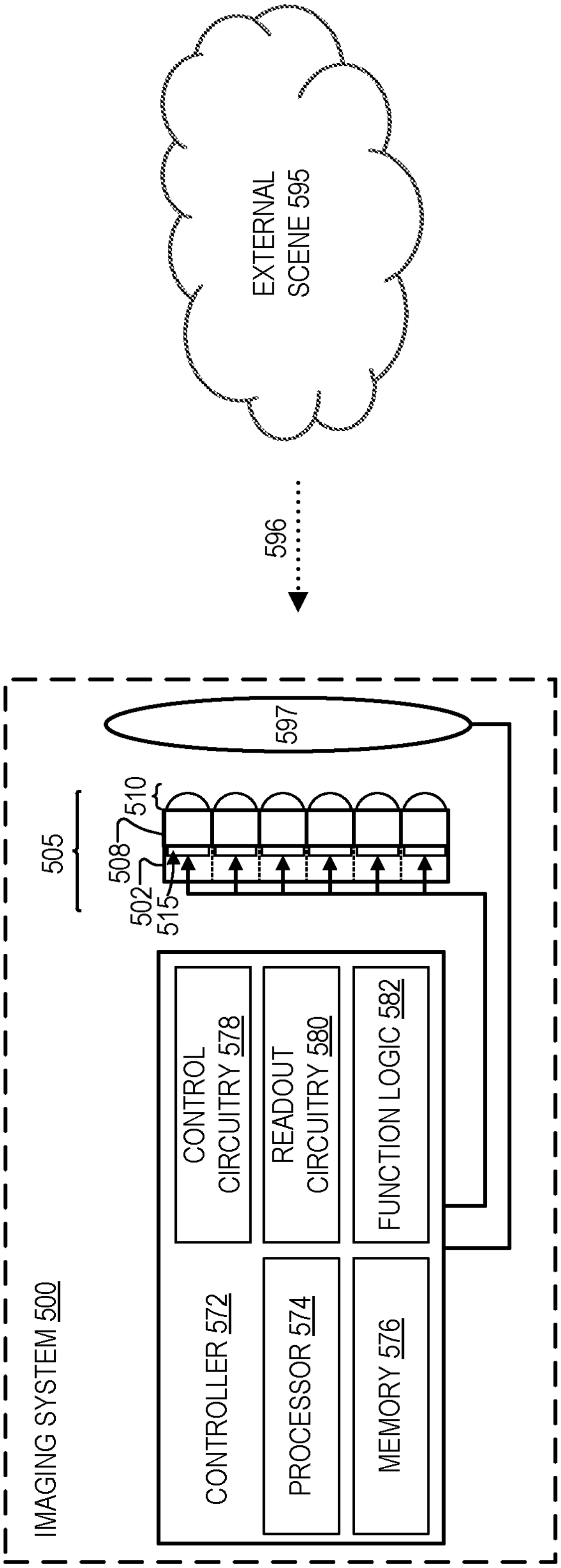
FIG. 5 is a functional block diagram of an imaging system including a plurality of pixel cells, each pixel cell including a vertical transfer gate, in accordance with embodiments of the present disclosure.

FIG. 5 is a functional block diagram of an imaging system 500 including a plurality of pixel cells 505, each pixel cell including a vertical transfer gate, in accordance with embodiments of the present disclosure. More specifically, each pixel cell included in the plurality of pixel cells 505 may correspond to or otherwise include the same or similar features as the pixel cell 105 illustrated in FIG. 1, the pixel cell 205-1 illustrated in FIGS. 2A-2B, the pixel cell 205-2 illustrated in FIG. 2C, the pixel cell 305 illustrated in FIGS. 3A-3B, or combinations thereof, in accordance with embodiments of the present disclosure. The imaging system 500 includes the plurality of pixel cells 505 to generate electrical or image signals in response to incident light 596, objective lens(es) 597 with adjustable optical power to focus on one or more points of interest within the external scene 595, and controller 572 to control, inter alia, operation of the plurality of pixel cells 505 and the objective lens(es) 597. The plurality of pixel cells 505 is a simplified schematic showing a semiconductor substrate 502 with a plurality of photodiodes 515 disposed within respective portions of the semiconductor substrate 502, a plurality of color filters 508, and a plurality of microlenses 510. The controller 572 includes one or more processors 574, memory 576, control circuitry 578, readout circuitry 580, and function logic 582.

The controller 572 includes logic and/or circuitry to control the operation (e.g., during pre-, post-, and in situ phases of image and/or video acquisition) of the various components of imaging system 500. The controller 572 can be implemented as hardware logic (e.g., application specific integrated circuits, field programmable gate arrays, system-on-chip, etc.), software/firmware logic executed on a general-purpose microcontroller or microprocessor, or a combination of both hardware and software/firmware logic. In one embodiment, the controller 572 includes the processor 574 coupled to memory 576 that stores instructions for execution by the controller 572 and/or one or more other components of the imaging system 500. The instructions, when executed, can cause the imaging system 500 to perform operations associated with the various functional modules, logic blocks, or circuitry of the imaging system 500 including any one of, or a combination of, the control circuitry 578, the readout circuitry 580, the function logic 582, plurality of pixel cells 505, objective lens 597, and any other element of imaging system 500 (illustrated or otherwise). The memory is a non-transitory computer-readable medium that can include, without limitation, a volatile (e.g., RAM) or non-volatile (e.g., ROM) storage system readable by controller 572. It is further appreciated that the imaging system 500 can be a monolithic integrated circuit, one or more discrete interconnected electrical components, or a combination thereof, which may be formed on one or more substrates that are coupled together (e.g., as illustrated in FIG. 4). Additionally, in some embodiments one or more electrical components can be coupled together to collectively function as controller 572 for orchestrating operation of the imaging system 500.

Control circuitry 578 can control operational characteristics of the array formed by the plurality of photodiodes 515 (e.g., exposure duration, when to capture digital images or videos, and the like). Readout circuitry 580 reads or otherwise samples the analog signal from the individual photodiodes (e.g., read out electrical signals generated by each of the plurality of photodiodes 515 in response to incident light to generate image signals for capturing an image frame, and the like) and can include amplification circuitry, analog-to-digital converter (ADC) circuitry, image buffers, or otherwise. In the illustrated embodiment, readout circuitry 580 is included in controller 572, but in other embodiments readout circuitry 580 can be separate from the controller 572. Function logic 582 is coupled to the readout circuitry 580 to receive image data to de-mosaic the image data and generate one or more image frames.

Embodiments of the disclosure illustrated in at least FIGS. 1-5 may utilize conventional semiconductor device processing and microfabrication techniques known by one of ordinary skill in the art, which may include, but is not limited to, photolithography, ion implantation, chemical vapor deposition, physical vapor deposition, thermal evaporation, sputter deposition, reactive-ion etching, plasma etching, wafer bonding, chemical mechanical planarization, and the like. It is appreciated that the described techniques are merely demonstrative and not exhaustive and that other techniques may be utilized to fabricate one or more components of various embodiments of the disclosure.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Spatially relative terms, such as “beneath,” “below,” “over,” “under,” “above,” “upper,” “top,” “bottom,” “left,” “right,” “center,” “middle,” and the like, can be used herein for ease of description to describe one element or feature’s relationship relative to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as “below” or “beneath” or “under” other elements or features would then be oriented “above” the other elements or features. Thus, the exemplary terms “below” and “under” can encompass both an orientation of above and below. The device can be otherwise oriented (rotated ninety degrees or at other orientations) and the spatially relative descriptors used herein are interpreted accordingly. In addition, it will also be understood that when an element is referred to as being “between” two other elements, it can be the only element between the two other elements or one or more intervening elements can also be present.

Throughout this specification, several terms of art are used. These terms are to take on their ordinary meaning in the art from which they come, unless specifically defined herein or the context of their use would clearly suggest otherwise. It should be noted that element names and symbols can be used interchangeably through this document (e.g., Si vs. silicon); however, both have identical meaning.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A pixel cell for an image sensor, comprising:

a photodiode disposed within a semiconductor substrate, the semiconductor substrate including a first side and a second side opposite the first side, wherein the photodiode includes a shallow doped region and a deep doped region, each having a same conductivity type, and wherein the shallow doped region is disposed between the first side of the semiconductor substrate and the deep doped region;

a transfer gate coupled to the photodiode, the transfer gate including a vertical portion extending into the semiconductor substrate adjacent to the shallow doped region and from the first side towards the deep doped region of the photodiode, wherein, when the pixel cell is viewed from a plan view, the shallow doped region includes a base segment and a protrusion extending from the base segment, wherein the protrusion is separated from the vertical portion by a first lateral separation distance and the base segment is separated from the vertical portion by a second lateral separation distance different from the first lateral separation distance.

2. The pixel cell of claim 1, further comprising a floating diffusion region disposed within the semiconductor substrate, wherein the photodiode is adapted to photogenerate image charge in response to incident light, wherein the transfer gate is adapted to transfer the image charge from the photodiode to the floating diffusion region along a main transfer path, and wherein the main transfer path extends through the first lateral separation distance between the protrusion of the shallow doped region and the vertical portion of the transfer gate.

3. The pixel cell of claim 2, wherein the shallow doped region of the photodiode, the vertical portion of the transfer gate, and the floating diffusion region are collectively configured such that an axis extending through both a center of shallow doped region and a center of the floating diffusion region is tangential to the vertical portion of the transfer gate.

4. The pixel cell of claim 1, wherein the first lateral separation distance is smaller than any other lateral separation distance, including the second lateral separation distance, between the vertical portion of the transfer gate and the shallow doped region.

5. The pixel cell of claim 1, wherein when the pixel cell is viewed from the plan view, a first edge of the vertical portion extends adjacent to a first boundary of the protrusion.

6. The pixel cell of claim 5, wherein when the pixel cell is viewed from the plan view, the first edge of the vertical portion extends adjacent to a second boundary of the base segment, and wherein the first boundary and the second boundary are each facing the first edge of the vertical portion.

7. The pixel cell of claim 6, wherein the shallow doped region includes a second protrusion extending from the base segment opposite the first protrusion such that the shallow doped region at least partially surrounds the vertical portion of the transfer gate.

8. The pixel cell of claim 7, wherein the vertical portion of the transfer gate includes a second edge perpendicular to the first edge, wherein the second protrusion includes a third boundary facing the second edge, and wherein the second edge of the vertical portion extends adjacent to a third boundary of the second protrusion.

9. The pixel cell of claim 5, wherein when the pixel cell is viewed from the plan view, a second edge of the vertical portion extends adjacent to a second boundary of the base segment, wherein the first boundary is facing the first edge and the second boundary is facing the second edge, and wherein the first edge is perpendicular to the second edge.

10. The pixel cell of claim 1, wherein the deep doped region of the photodiode has a greater lateral area than a combined lateral area of the shallow doped region and the vertical portion of the transfer gate.

11. The pixel cell of claim 1, wherein the transfer gate further includes a planar portion coupled to the vertical portion, wherein the first side of the semiconductor substrate is disposed between the planar portion and the protrusion of the shallow doped region.

12. The pixel cell of claim 1, wherein a first doping concentration of the protrusion included in the shallow doped region proximate to the vertical portion of the transfer gate is greater than a second doping concentration of the base segment.

13. The pixel cell of claim 1, wherein when viewed from the plan view, the shallow doped region is non-uniformly separated from the vertical portion of the transfer gate, and wherein the shallow doped region of the photodiode consists of the base segment and the protrusion.

14. The pixel cell of claim 1, further comprising:

a floating diffusion region disposed within the semiconductor substrate proximate to the photodiode; and three additional photodiodes, each with a respective base segment and a respective protrusion extending from the respective base segment included in a respective shallow doped region, wherein the three additional photodiodes and the photodiode are included in a plurality of photodiodes that laterally surround the floating diffusion region and are each electrically coupled to the floating diffusion region.

15. The pixel cell of claim 14, wherein the shallow doped region of the photodiode and the three additional photodiodes are arranged around the floating diffusion region such that there is mirror symmetry about two perpendicular axes when the pixel cell is viewed from the plan view.

16. The pixel cell of claim 15, further comprising three additional transfer gates, each including a respective vertical portion extending into the semiconductor substrate, wherein the three additional transfer gates respectively couple the three additional photodiodes to the floating diffusion region, and wherein the mirror symmetry of the pixel cell includes at least the photodiode, the three additional photodiodes, the transfer gate, and the three additional transfer gates.

* * * * *